United States Patent
Gourhant et al.

(10) Patent No.: US 8,802,575 B2
(45) Date of Patent: Aug. 12, 2014

(54) METHOD FOR FORMING THE GATE INSULATOR OF A MOS TRANSISTOR

(75) Inventors: Olivier Gourhant, Goncelin (FR); David Barge, Grenoble (FR); Clément Gaumer, Seyssinet-Pariset (FR); Mickaël Gros-Jean, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 77 days.

(21) Appl. No.: 13/443,348

(22) Filed: Apr. 10, 2012

(65) Prior Publication Data

US 2012/0270410 A1   Oct. 25, 2012

(30) Foreign Application Priority Data

Apr. 19, 2011   (FR) .................... 11 53388

(51) Int. Cl.
- *H01L 21/31* (2006.01)
- *H01L 21/02* (2006.01)
- *H01L 21/318* (2006.01)
- *H01L 21/316* (2006.01)

(52) U.S. Cl.
CPC ........... *H01L 21/022* (2013.01); *H01L 21/3185* (2013.01); *H01L 21/02274* (2013.01); *H01L 21/31612* (2013.01); *H01L 21/02164* (2013.01)
USPC ........................................................ 438/763

(58) Field of Classification Search
CPC .............. H01L 21/3185; H01L 21/02274; H01L 21/31612; H01L 21/02164; H01L 21/022
USPC .......... 438/758, 761–769, 775–779, 783, 786
See application file for complete search history.

(56) References Cited

U.S. PATENT DOCUMENTS

| | | |
|---|---|---|
| 2007/0166892 A1 | 7/2007 | Hori |
| 2008/0014692 A1 | 1/2008 | Burnham et al. |

FOREIGN PATENT DOCUMENTS

| | | | |
|---|---|---|---|
| EP | 0973189 A2 | 1/2000 | |
| EP | 0973189 A2 * | 1/2000 | ............. H01L 21/28 |
| JP | 10178170 A | 6/1998 | |

OTHER PUBLICATIONS

S. Wolf and R.N. Tauber, Silicon Processing for the VLSI Era: vol. 1-Process Technology 265-289 (2nd Ed. 2000).*
Thin SiO2 Insulators Grown by Rapid Thermal Oxidation of Silicon Mehrdad M. Moslehi et al., Appl. Phys. Lett. 47, 1353 (1985).*
High Dielectric Constant Oxides J. Robertson, Eu. Phys. J. Appl. Phys. 28, 265-291 (2004).*
S. Wolf and R.N. Tauber, Silicon Processing for the VLSI Era: vol. 1—Process Technology 265-289 (2nd Ed. 2000).*
S.V. Hattangady, Controlled Nitrogen Incorporation at the Gate Oxide Surface, Appl. Phys. Lett. vol. 66 No. 25 3495-3497 (1995).*

* cited by examiner

*Primary Examiner* — Anthony Ho
(74) *Attorney, Agent, or Firm* — The Noblitt Group, PLLC

(57) ABSTRACT

A method for forming the gate insulator of a MOS transistor, including the steps of: a) forming a thin silicon oxide layer at the surface of a semiconductor substrate; b) incorporating nitrogen atoms into the silicon oxide layer by plasma nitridation at a temperature lower than 200° C., to transform this layer into a silicon oxynitride layer; and c) coating the silicon oxynitride layer with a layer of a material of high dielectric constant, wherein steps b) and c) follow each other with no intermediate anneal step.

7 Claims, 2 Drawing Sheets

METHOD FOR FORMING THE GATE INSULATOR OF A MOS TRANSISTOR

CROSS REFERENCE TO RELATED APPLICATION

This application is a translation of and claims the priority benefit of French patent application number 11/53388, filed on Apr. 19, 2011, entitled "Method for forming the gate insulator of a MOS transistor," which is hereby incorporated by reference to the maximum extent allowable by law.

BACKGROUND OF THE INVENTION

1. Field of the Invention

The present invention relates to the forming of a MOS transistor. It more specifically relates to the forming of the gate insulator of a MOS transistor.

2. Discussion of Prior Art

In conventional MOS transistors, above the channel region, a silicon oxide insulating layer (gate insulator) forms an interface between the semiconductor substrate and the gate. The tendency of transistors to miniaturize and to have increasing operating speeds has resulted in strongly decreasing the thickness of this silicon oxide layer. As a result, leakage currents between the gate and the substrate increase. Below a given silicon oxide thickness, for example, on the order of 2 nm, the leakage currents crossing the gate insulator are no longer acceptable for current applications.

It has been suggested to form the gate insulator with a material of greater dielectric constant than silicon oxide. This enables forming a thicker gate insulator, and thus decreasing leakage currents, without modifying the gate-substrate capacitance value. It has especially been suggested to form the gate insulator with silicon oxynitride (SiON), which has a dielectric constant ranging from approximately 6 to 8, while silicon oxide has a 3.9 dielectric constant.

FIGS. 1A to 1E are partial simplified cross-section views showing steps of a method for forming a MOS transistor inside and on top of a semiconductor substrate 11, for example, made of silicon, wherein the gate insulator is made of silicon oxynitride.

FIG. 1A illustrates the forming of a silicon oxide layer 12, coating substrate 11 above the transistor channel region. Layer 12 may be formed by oxidation in a step of cleaning of the transistor channel surface in the presence of water.

FIG. 1B illustrates a rapid thermal anneal step, during which the substrate is heated up to a temperature approximately ranging from 800 to 1,200° C. in the presence of oxygen, for a short period, for example approximately ranging from a few seconds to a few minutes. During this step, oxide layer 12 transforms into a thermal silicon oxide layer 13, of better electric quality than oxide 12. Such an anneal is generally designated as RTO in the art, for "Rapid Thermal Oxidation".

FIG. 1C illustrates a step during which nitrogen atoms are incorporated into silicon oxide layer 13. Layer 13 is exposed to a plasma comprising nitrogen, at low temperature, for example on the order of 100° C. or less. The adsorption of nitrogen atoms followed by their diffusion into the silicon oxide transforms layer 13 into a silicon oxynitride layer 14, of greater dielectric constant. Such a method is currently called DPN in the art, for "Decoupled Plasma Nitridation".

FIG. 1D illustrates a step of thermal anneal for stabilizing the nitrogen atom concentration in layer 14. Indeed, after the nitridation, a relatively fast nitrogen desorption occurs. To stop such a desorption, the substrate is heated up for a short period, for example, approximately ranging from a few seconds to a few minutes, to a temperature approximately ranging from 800 to 1,200° C., in an atmosphere containing oxygen. This results in a slight oxidation of the surface of layer 14, which blocks the desorption and enables the stabilization of the nitrogen concentration in layer 14. An oxidation can also be observed at the interface between layer 14 and substrate 11. Such an anneal is generally called PNA in the art, for "Post-Nitridation Anneal".

FIG. 1E illustrates the forming, after the stabilization anneal, of a conductive gate 15 coating gate insulator 14. Gate 15 is for example made of polysilicon, metal, or a stack of various conductive materials.

A disadvantage of this type of transistor is that the dielectric constant of silicon oxynitride remains relatively low and thus does not enable to satisfy the needs of the most advanced technological processes. It has been provided to form the gate insulator in materials of higher dielectric constant than silicon oxynitride, for example, materials having a dielectric constant approximately ranging from 10 to 80. Such materials are currently called "high-K" in the art. They for example comprise hafnium silicate ($Hf_xSi_yO_z$), hafnium oxide ($HfO_2$), zirconium oxide ($ZrO_2$), tantalum oxide ($Ta_2O_5$), etc.

FIG. 2 is a partial simplified cross-section view of a MOS transistor 20 formed inside and on top of a semiconductor substrate 21, for example, made of silicon, in which the gate insulator comprises a layer 23 of hafnium silicate ($Hf_xSi_yO_z$). The gate oxide of transistor 20 further comprises a thin silicon oxynitride layer 22, which forms the interface between substrate 21 and layer 23. A conductive gate 25, for example, made of metal, polysilicon, or a stack of various conductive materials, coats layer 23.

Interface layer 22 is necessary to guarantee a good interface quality between the gate insulator and substrate 21. However, the presence of this layer results in decreasing the equivalent dielectric constant of the assembly formed by the stacking of layers 22 and 23. Layer 22 is thus desired to be as thin as possible.

A disadvantage of usual manufacturing processes is that they do not enable the forming of a silicon oxynitride interface layer below a given thickness (for example, on the order of 1.2 nm).

SUMMARY OF THE INVENTION

Thus, an embodiment provides a method for forming the gate insulator of a MOS transistor, this method at least partly overcoming some of the disadvantages of existing solutions.

An embodiment provides such a method in which the gate insulator comprises a layer of a material of high dielectric constant such as hafnium silicate, and a silicon oxynitride interface layer between the material of high dielectric constant and the substrate, this method enabling the obtaining of a thinner interface layer than current methods.

An embodiment provides such a method which does not require the provision of equipment and/or of additional steps with respect to usual methods.

Thus, an embodiment provides a method for forming the gate insulator of a MOS transistor, comprising the steps of: a) forming a thin silicon oxide layer at the surface of a semiconductor substrate; b) incorporating nitrogen atoms into the silicon oxide layer by plasma nitridation at a temperature lower than 200° C., to transform this layer into a silicon oxynitride layer; and c) coating the silicon oxynitride layer with a layer of a material of high dielectric constant, wherein steps b) and c) follow each other with no intermediate anneal step.

According to an embodiment, step c) is implemented by chemical deposition at a temperature lower than 700° C.

According to an embodiment, step b) is implemented at a temperature lower than 100° C.

According to an embodiment, steps b) and c) are implemented successively without ever exceeding a 700° C. temperature.

According to an embodiment, the material of high dielectric constant is a material from the group comprising hafnium silicate (HfSiO), hafnium oxide (HfO$_2$), zirconium oxide (ZrO$_2$), and tantalum oxide (Ta$_2$O$_5$).

According to an embodiment, at the end of step c), the thickness of the silicon oxynitride layer is lower than 1.2 nm, to this layer comprising a nitrogen atom concentration greater than $1 \times 10^{14}$ atoms/cm$^2$.

According to an embodiment, the silicon oxide layer formed at step a) has a thickness on the order of 1 nm.

According to an embodiment, step a) comprises the forming, by chemical deposition, of a silicon oxide layer, followed by a rapid thermal oxidation at a temperature ranging between 800 and 1,200° C.

The foregoing and other features, and benefits will be discussed in detail in the following non-limiting description of specific embodiments in connection with the accompanying drawings.

DETAILED DESCRIPTION

Figure 1A:
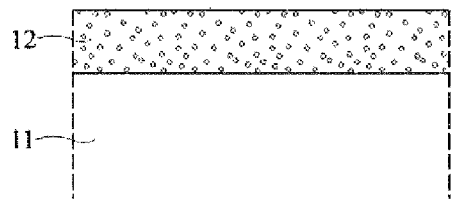
FIGS. 1A to 1E, previously described, are partial simplified cross-section views showing steps of a method for forming a MOS transistor in which the gate insulator is made of silicon oxynitride.
Figure 1B:
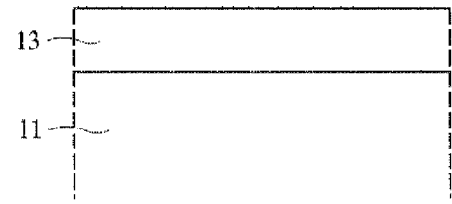
Figure 1C:
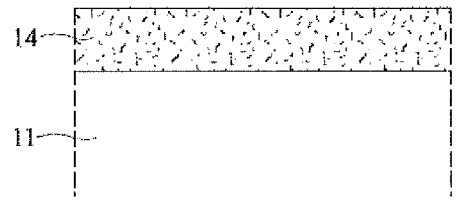
Figure 1D:
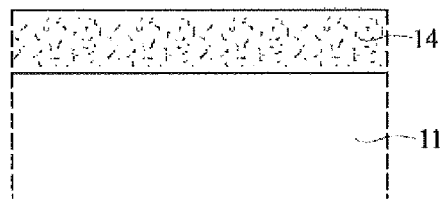
Figure 1E:
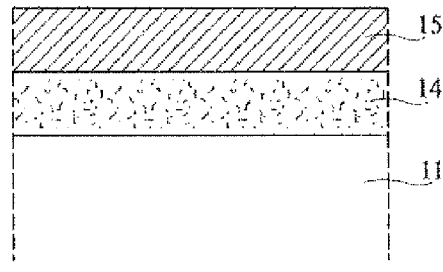

For clarity, the same elements have been designated with the same reference numerals in the different drawings and, further, as usual in the representation of integrated circuits, the various drawings are not to scale.

Figure 2:
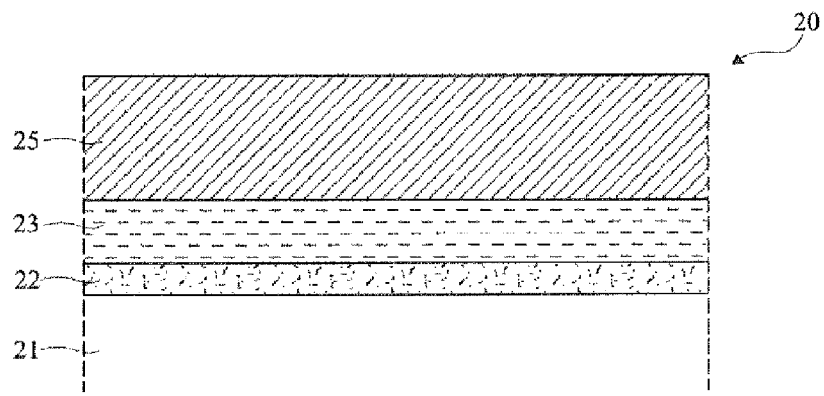
FIG. 2, previously described, is a partial simplified cross-section view of a MOS transistor in which the gate insulator comprises a layer of a material of high dielectric constant such as hafnium silicate.

FIGS. 3A to 3E are partial simplified cross-section views showing steps of an exemplary method for forming a MOS transistor of the type described in relation with FIG. 2, in which the gate insulator comprises a layer of a material of high dielectric constant such as hafnium silicate.

Figure 3A:
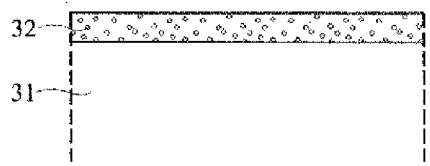
FIGS. 3A to 3E are partial simplified cross-section views showing steps of an exemplary method for forming a MOS transistor in which the gate insulator comprises a layer of a material of high dielectric constant such as hafnium silicate.

FIG. 3A illustrates the forming of a silicon oxide layer 32, coating substrate 31 above the transistor channel region. In this example, layer 32 is made of a chemical silicon oxide produced by oxidation of the silicon substrate in the presence of water. Layer 32 is fabricated to be as thin as possible for an acceptable industrial production cost. As an example, layer 32 has a thickness on the order of 1 nm. As a variation, layer 32 may be the oxide naturally present at the substrate surface in the case where said substrate has stayed in an oxidizing environment. (In this case, layer 32 may also have a thickness on the order of 1 nm.)

Figure 3B:
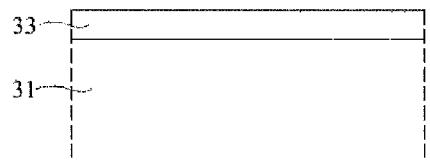

FIG. 3B illustrates an RTO-type rapid thermal anneal step, during which the substrate is heated up to a temperature ranging from approximately 800 to 1,200° C. for a short period, for example ranging from approximately a few seconds to a few minutes. Chemical silicon oxide layer 32 transforms into a thermal oxide layer 33 of better electric quality than layer 32.

Figure 3C:
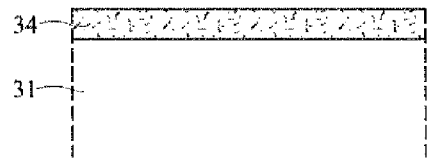

FIG. 3C illustrates a step during which nitrogen atoms are incorporated into silicon oxide layer 33 by a DPN-type nitridation method. Layer 33 is exposed to a plasma comprising nitrogen, at low temperature, for example below 100° C. The adsorption of nitrogen atoms and their diffusion into the silicon oxide results in transforming layer 33 into a silicon oxynitride layer 34.

Figure 3D:
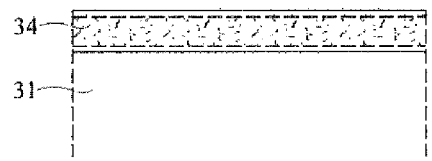

FIG. 3D illustrates a PNA-type thermal anneal step for stabilizing the nitrogen atom concentration in layer 34. To prevent the desorption of nitrogen, the substrate is heated up for a short period, for example, ranging from approximately 800 to 1,200° C., in an atmosphere containing oxygen. This results in a slight oxidation of the surface of layer 34, which blocks the desorption and enables to stabilize the nitrogen atom concentration in layer 34.

Figure 3E:
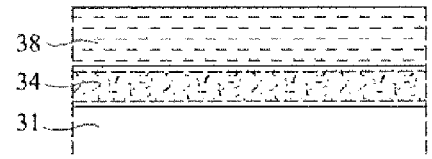

FIG. 3E illustrates the forming of a layer 38 of a material of high dielectric constant such as hafnium silicate, above silicon oxynitride interface layer 34. A conductive gate, not shown, is then formed, which coats layer 38. The gate for example comprises metal, polysilicon, or any other adapted conductive material.

As appears in FIG. 3D, the PNA-type stabilization anneal step results in increasing the thickness of interface layer 34. In particular, the oxidation which occurs at the surface of layer 34 results in thickening this layer from the top, for example, by approximately 0.1 to 0.3 nm. The anneal also causes an oxidation of the surface of substrate 31, at the interface between substrate 31 and layer 34. This results in thickening layer 34 from the bottom, for example, by approximately 0.1 to 0.3 nm. Thus, the stabilization anneal causes a thickening of the interface layer approximately ranging from 0.2 to 0.6 nm, which results in decreasing the equivalent dielectric constant of the stack of layers 34 and 38.

It should be noted that there exist silicon oxide layer nitridation methods which enable to directly form a silicon oxynitride layer having a stable nitrogen atom content, and which thus do not require providing a stabilization anneal. One such method for example is a thermal nitridation, performed at high temperature according to a method current called RTN in the art, for "Rapid Thermal Nitridation". However, such methods do not provide a sufficient nitrogen atom concentration, for example, greater than $1 \times 10^{15}$ atoms/cm$^2$. Further, they do not provide a good quality of interface with the semiconductor substrate and result in decreasing the mobility of carriers in the channel region.

FIGS. 4A to 4D are partial simplified cross-section views showing steps of an embodiment of a method for forming a MOS transistor in which the gate insulator comprises a layer of a material of high dielectric constant such as hafnium silicate.

The present inventors have observed that the layer of a material of high dielectric constant, when it is deposited on a non-annealed silicon oxynitride layer, having a nitrogen concentration which decreases along time, has the property of blocking the nitrogen desorption. Thus, the forming of the layer of the material of high dielectric constant enables to stabilize the nitrogen concentration of silicon oxynitride. The present inventors provide using a method of the type described in relation with FIGS. 3A to 3E, but in which the layer of a material of high dielectric constant is formed immediately after the nitridation of the interface layer, with no intermediate stabilization anneal.

Figure 4A:
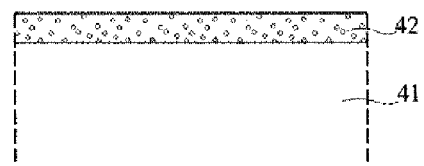
FIGS. 4A to 4D are partial simplified cross-section views showing steps of an embodiment of a method for forming a MOS transistor in which the gate insulator comprises a layer of a material of high dielectric constant such as hafnium silicate.

FIG. 4A illustrates the forming of a silicon oxide layer 42, coating substrate 41 above the transistor channel region. Layer 42 may be formed by chemical oxidation of the silicon substrate in the presence of water. As a variation, layer 42 may be the oxide naturally present at the substrate surface in the case where said substrate has stayed in an oxidizing environment.

Figure 4B:
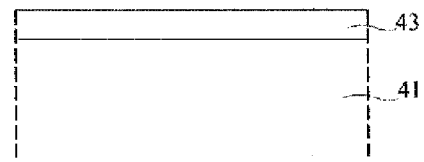

FIG. 4B illustrates a step of RTO-type rapid thermal anneal, during which chemical silicon oxide layer 42 transforms into a thermal silicon oxide layer 43 of better electric quality than layer 42 (better reticulation of the Si—O links and removal of residual solvent molecules).

Figure 4C:
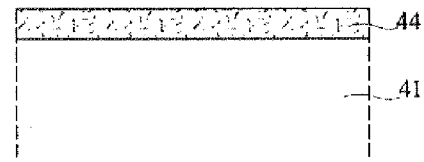

FIG. 4C illustrates a step during which nitrogen atoms are incorporated into silicon oxide layer 43 by a DPN-type nitridation method. Layer 43 is exposed to a plasma comprising nitrogen, at low temperature, for example below 200° C., and preferably below 100° C. The adsorption of nitrogen atoms and their diffusion into the silicon oxide results in transforming layer 43 into a silicon oxynitride layer 44.

Figure 4D:
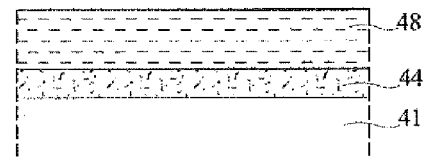

FIG. 4D illustrates the forming of a layer 48 of a material of high dielectric constant such as hafnium silicate, above silicon oxynitride interface layer 44. Layer 48 is formed immediately after the plasma nitridation, with no intermediate stabilization anneal. It should be noted that layer 48 may be formed in the same equipment as the nitridation equipment, which enables minimizing the time between two operations. Layer 48 is for example formed by an MOCVD ("Metal-Organic Chemical Vapor Deposition") or ALD ("Atomic Layer Deposition") deposition. Layer 48 may in particular be formed at a temperature lower than 700° C., for example, on the order of 600° C. Thus, the steps of nitridation (FIG. 4C) and forming of the layer of the material of high dielectric constant (FIG. 4D) can be implemented without ever exceeding a 700° C. temperature.

A conductive gate, not shown, is then formed, which coats layer 48. The gate is for example made of metal, polysilicon, or a stack of various conductive materials.

A benefit of the provided method is that, due to the suppression of the stabilization anneal following the plasma nitridation, the silicon oxynitride interface layer may be thinner than interface layers formed by current methods. As an example, the provided method enables the forming of a silicon oxynitride interface layer having a thickness smaller than 1.2 nm, and containing nitrogen atoms at a concentration greater than $1\times10^{14}$ atoms/cm$^2$ and preferably ranging between $1\times10^{15}$ and $3\times10^{15}$ atoms/cm$^2$, which is not possible with usual methods.

Another benefit of the provided method is that it comprises one less anneal than current methods, which decreases the transistor manufacturing cost. Further, the provided method can be implemented without modifying current equipment.

Specific embodiments of the present invention have been described. Various alterations, modifications and improvements will readily occur to those skilled in the art.

In particular, the present invention is not limited to the specific example described hereabove, in which the layer of the material of high dielectric constant is made of hafnium silicate. It will be within the abilities of those skilled in the art to adapt the provided method by using other materials of high dielectric constant, such as hafnium oxide (HfO$_2$), zirconium oxide (ZrO$_2$), tantalum oxide (Ta$_2$O$_5$), etc. Further, an additional step (not described hereabove) of doping the layer of high dielectric constant with nitrogen may be provided, to to increase the reliability.

Further, the present invention is not limited to the above-described example in which silicon oxide layer 43 (FIG. 4B) which is used as a basis for the forming of the silicon oxynitride interface layer, is formed by chemical oxidation of the substrate in the presence of water (in aqueous phase), followed by a thermal oxidation. It will be within the abilities of those skilled in the art to use any other adapted method to form the initial silicon oxide layer.

Further, the present invention is not limited to the examples of numerical values, and in particular to the thicknesses and temperatures mentioned hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming the gate insulator of a MOS transistor, comprising the steps of:
   a) forming a thin silicon oxide layer at the surface of a semiconductor substrate;
   b) incorporating nitrogen atoms into the silicon oxide layer by plasma nitridation at a temperature lower than 200° C., to transform the silicon oxide layer into a silicon oxynitride layer comprising a nitrogen atom concentration greater than $1\times10^{14}$ atoms/cm$^2$; and
   c) coating the silicon oxynitride layer with a layer of a material of higher dielectric constant than silicon oxynitride,
   wherein steps b) and c) follow each other with no intermediate anneal step, and wherein step a) comprises the forming, by chemical deposition, of the silicon oxide layer, followed by a rapid thermal oxidation at a temperature ranging between 800 and 1,200 degrees C.

2. The method of claim 1, wherein step c) is implemented by chemical deposition at a temperature lower than 700° C.

3. The method of claim 1, wherein step b) is implemented at a temperature lower than 100° C.

4. The method of claim 1, wherein steps b) and c) are implemented successively without ever exceeding a 700° C. temperature.

5. The method of claim 1, wherein the material of high dielectric constant is a material from the group comprising hafnium silicate (HfSiO), hafnium oxide (HfO$_2$), zirconium oxide (ZrO$_2$), and tantalum oxide (Ta$_2$O$_5$).

6. The method of claim 1, wherein, at the end of step c), the thickness of the silicon oxynitride layer is lower than 1.2 nm.

7. The method of claim 1, wherein the silicon oxide layer formed at step a) has a thickness on the order of 1 nm.

* * * * *